United States Patent
Simmons et al.

(10) Patent No.: US 6,947,288 B2
(45) Date of Patent: Sep. 20, 2005

(54) PCMCIA CARD

(75) Inventors: Randy Gray Simmons, Lewisville, NC (US); Kevin John Peterson, High Point, NC (US)

(73) Assignee: Tyco Electronics Corporation, Middletown, PA (US)

( * ) Notice: Subject to any disclaimer, the term of this patent is extended or adjusted under 35 U.S.C. 154(b) by 104 days.

(21) Appl. No.: 10/354,497

(22) Filed: Jan. 30, 2003

(65) Prior Publication Data

US 2003/0223200 A1 Dec. 4, 2003

Related U.S. Application Data

(63) Continuation of application No. 09/678,519, filed on Oct. 3, 2000, now abandoned.
(60) Provisional application No. 60/172,399, filed on Dec. 17, 1999.

(51) Int. Cl.[7] .................................................. H05K 1/14
(52) U.S. Cl. ....................... 361/737; 361/801; 361/816; 174/35 MS; 29/830; 29/831
(58) Field of Search ................................ 361/737, 756, 361/800, 801, 816, 818; 174/35 R, 51, 35 MS; 211/41.17; 439/76.1; 29/830–831, 876, 841

(56) References Cited

U.S. PATENT DOCUMENTS

| | | | | |
|---|---|---|---|---|
| 5,038,250 A | * | 8/1991 | Uenaka et al. | 361/737 |
| 5,502,892 A | * | 4/1996 | Lien | 29/841 |
| 5,923,026 A | * | 7/1999 | Onoda | 235/492 |
| 5,984,731 A | * | 11/1999 | Laity | 439/676 |
| 6,166,913 A | * | 12/2000 | Fun et al. | 361/737 |
| 6,320,252 B1 | * | 11/2001 | Potters et al. | 257/679 |
| 6,370,028 B1 | * | 4/2002 | Seeley et al. | 361/737 |

* cited by examiner

Primary Examiner—Kamand Cuneo
Assistant Examiner—Hung S. Bui

(57) ABSTRACT

A process of manufacturing a card comprising: (a) placing a circuit board within a plastic panel and a metal panel, the metal panel having a plurality of tabs with barbs thereon, the plastic panel having one or more cavities adapted for receiving the tabs; (b) inserting the tabs within the one or more cavities; and (c) transmitting energy to the plastic around the tab such that the plastic flows at least partially around the barbs; and a card made from the above process.

10 Claims, 6 Drawing Sheets

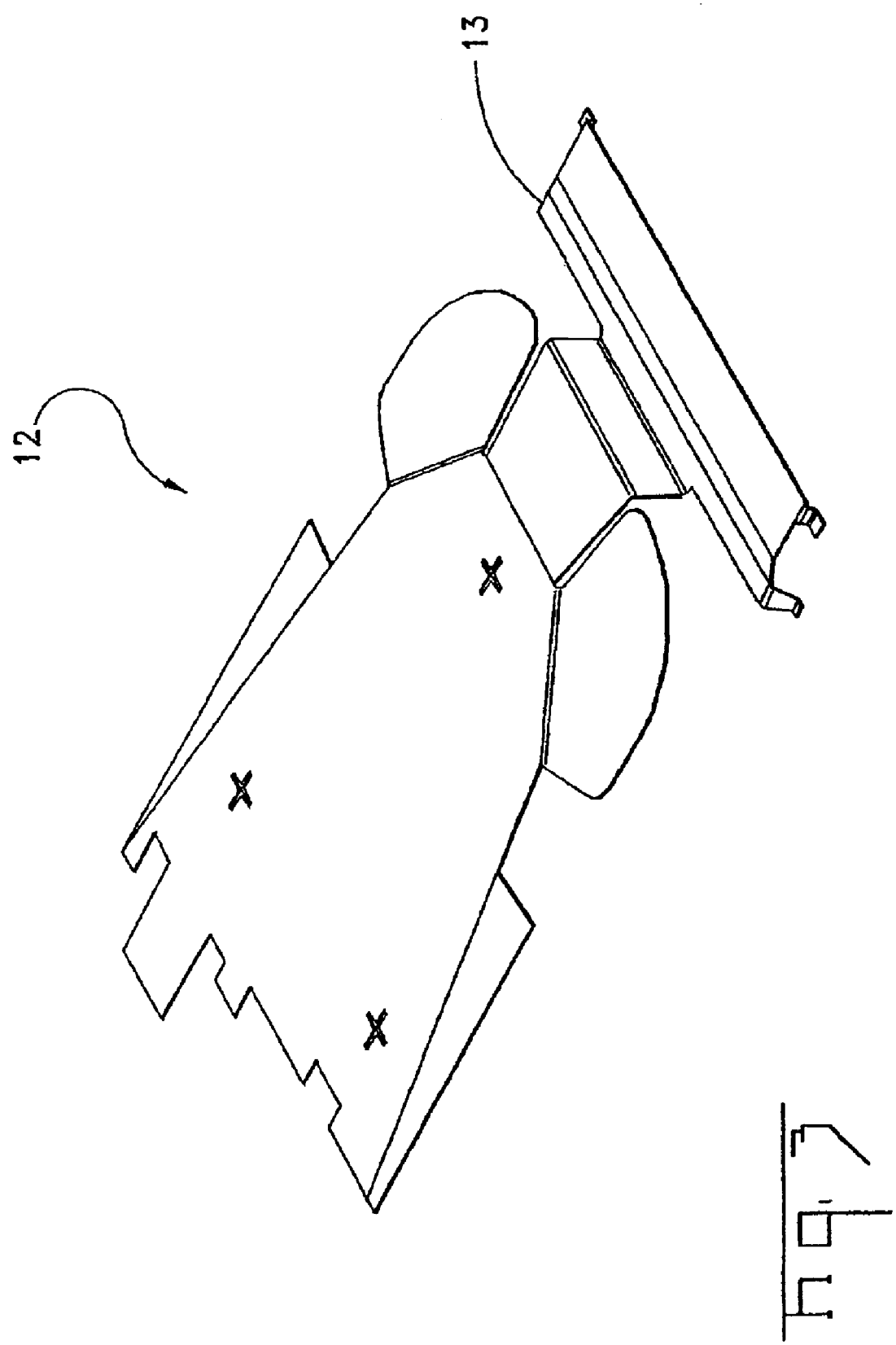

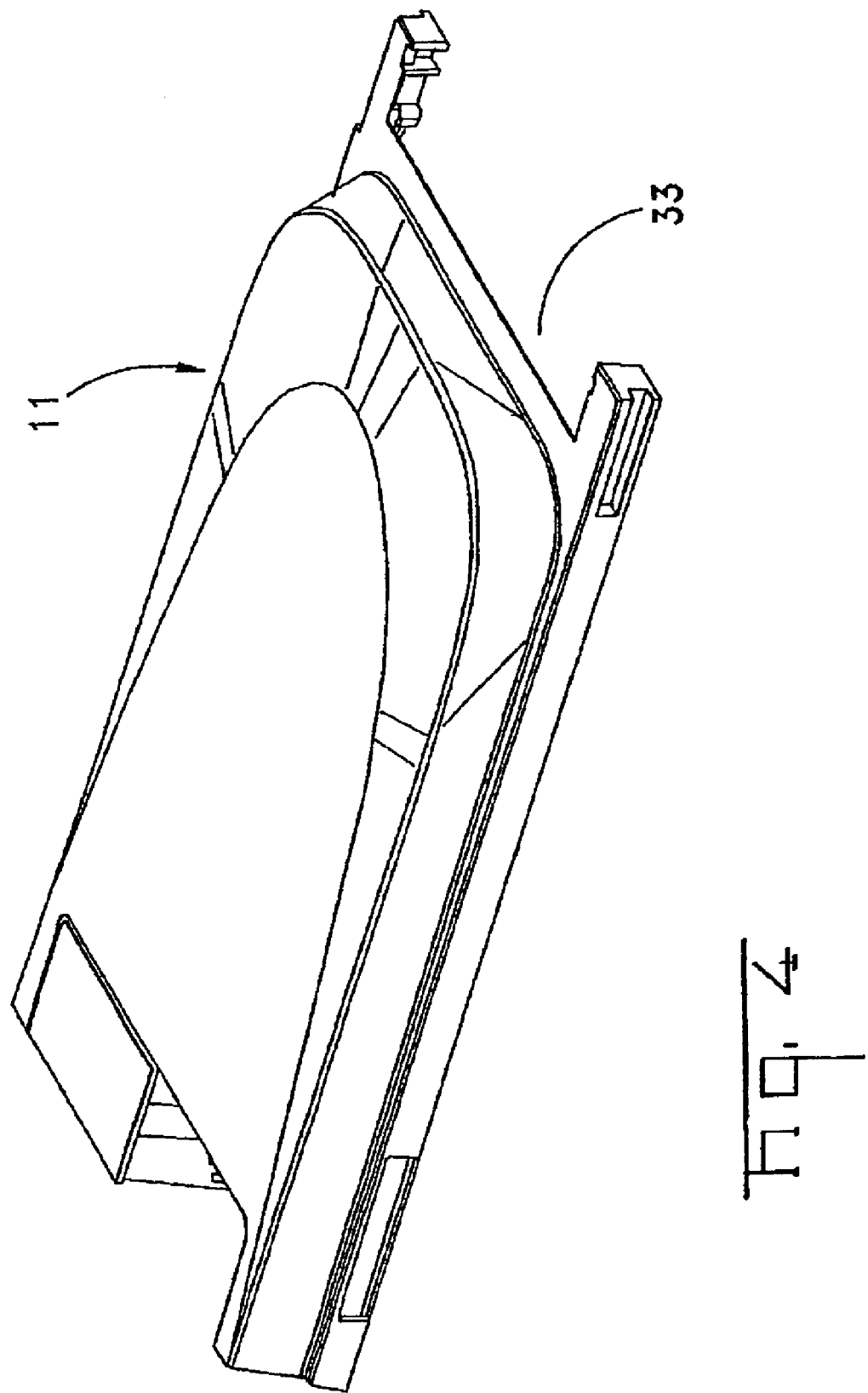

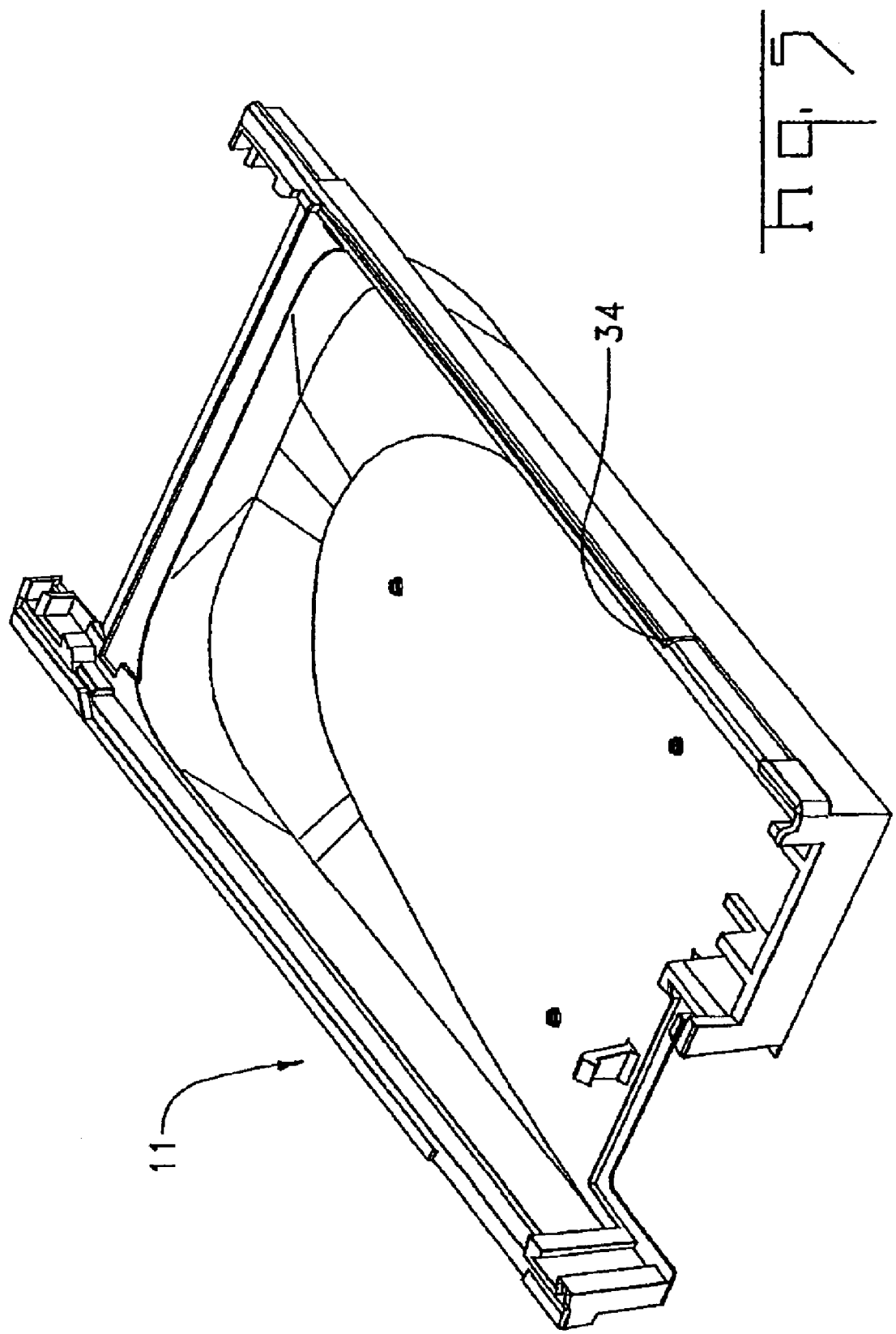

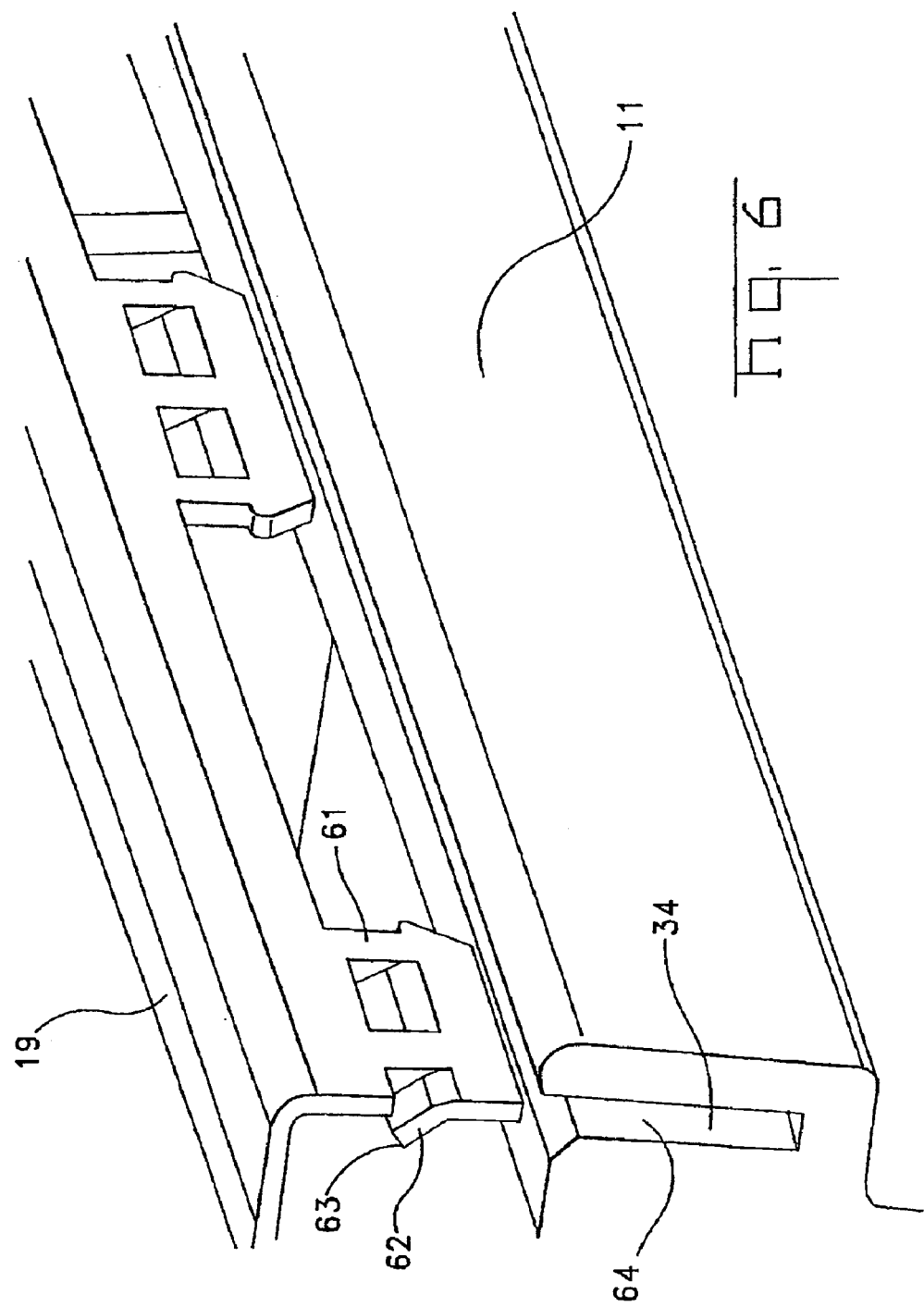

PCMCIA CARD

REFERENCE TO RELATED APPLICATIONS

The present application is a continuation of application Ser. No. 09/678,519 filed on Oct. 3, 2000, now abandoned which in turn was based on and entitled to the priority of Provisional Application No. 60/172,399 filed on Dec. 17, 1999, both of which are incorporated herein by reference.

FIELD OF THE INVENTION

This invention relates to electronic communication devices. More particularly, the present invention relates to connectors used to attach a communications line to a computer.

BACKGROUND OF THE INVENTION

Many of today's computers, computer peripherals and other electronic products are designed to receive removable devices or cards, conforming to standards established by the Personal Computer Memory Card International Association (PCMCIA). These standards define the electrical and physical specifications of the card, including the interfaces between the card and the port or slot into which the card is inserted, as well as three card form factors, called Type I, Type II and Type III.

PCMCIA cards may be used for various purposes such as, for example, to establish a communications link between portable computer users and corporate networks, the Internet and other on-line services from a wide variety of locations; to supplement the semiconductor memory of a personal or notebook computer; to store information or data for use by the host system; or to reconfigure the host system in response to information stored in the card.

PCMCIA cards typically include a substrate, usually rectangular and in the form of a printed circuit board (PCB) which contains electronic components including integrated circuit packages. The PCB is attached along one of its edges to a multiple connector typically including a connector of molded plastic having multiple contacts for electrically connecting the card to the host system by way of a port or slot. A typical PCMCIA card further includes a molded plastic, insulative frame and a sheet metal cover including upper and lower cover panels enclosing the PCB and having forward margins secured to upper and lower surfaces of the plastic connector. The metal cover not only protects the PCB, but also acts as a shield against electromagnetic interference.

Although effective as a protective shield against both physical damage and EMI, the metal shield tends to be limited in shape and is aesthetically less appealing than plastic. More specifically, because the panels tend to be pressed from sheet metal, multiple press runs are required to obtain the more intricate shapes that are desirable for today's highly-stylized PCMCIA cards which conform closely to the components they contain. As the number of press runs increases, however, so does manufacturing costs. Therefore, the shape of a metal panel usually is a compromise between the desired shape and manufacturing costs. Additionally, metal panels tend to be less aesthetically pleasing than plastic due to limitations in the texture and finish of the panel body.

Shape and aesthetic considerations thus tend to favor the use of plastic for such panels, given the moldability and flexibility plastic affords. Plastic panels have several shortcomings, however, which have traditionally discouraged their use. Specifically, plastic panels tend to be difficult to join to complementing metal panels using traditional techniques such as adhesion. A traditional approach for avoiding a plastic-to-metal connection is to use plastic inserts within the complementing metal panel and then ultrasonically weld the plastic inserts to the plastic panel. Although effective, this approach requires additional components and relatively complex metal panels and manufacturing steps, and therefore tends to be relatively expensive.

Therefore, there is a need for a PCMCIA card configuration that facilitates the use of highly-moldable and aesthetically-pleasing materials such as plastics, while not sacrificing the strength and EMI protection offered by metal. Such a card should also be fabricated using convention techniques such as ultrasonic welding. The present invention fulfills these needs among others.

SUMMARY OF THE INVENTION

The present invention provides for a card having a configuration that facilitates the use of aesthetically-pleasing moldable materials for a portion of the cover while avoiding the problems in conventional metal-to-plastic construction as mentioned above. To this end, the plastic panel and the conductive metal panel are configured to interconnect by flowing the plastic around anchor structures of the metal panel. More specifically, the conductive panel is configured with tabs having barbs thereon and the plastic panel is configured with slots to receive the barbs. Upon application of sufficient energy, the plastic flows around the bards, thereby anchoring the tabs in the plastic and preventing the separation of the plastic and metal panels.

Accordingly, one aspect of the invention is a card having plastic and metal panels joined together through ultrasonic welded or similar technique. In a preferred embodiment, the card comprises: (a) a circuit board; (b) a connector electrically connected to the circuit board and adapted for electrically connecting the circuit board to a host computer; (c) a housing having the circuit board mounted therein and configured to provide access to the connector, the housing comprising a metal panel interconnected to a plastic panel, the metal panel comprising a plurality of tabs with barbs thereon, the plastic panel having one or more cavities receiving the tabs; and (d) wherein the plastic of the plastic panel at least partially engulfs the barbs of the tabs to prevent withdrawal of the tabs from the one or more cavities and thereby interconnect the plastic and metal panels.

Another aspect of the invention is a process for manufacturing a card having a plastic panel joined to a metal panel. In a preferred embodiment, the process comprises: (a) placing a circuit board within a plastic panel and a metal panel, the metal panel having a plurality of tabs with barbs, the plastic panel having one or more cavities adapted for receiving the tabs; (b) inserting the tabs within the one or more cavities; and (c) transmitting energy to the plastic around the tab such that it flows at least partially around the barbs.

Yet another aspect of the invention is a card made from the process of the present invention.

Still another aspect of the invention is a communication device comprising the card of the present invention.

BRIEF DESCRIPTION OF THE DRAWINGS

FIG. 3 shows the grounding shield of the card of FIG. 1;

FIG. 4 shows a top perspective view of the plastic panel of the card of FIG. 1;

FIG. 5 shows a bottom perspective view of the plastic panel of the card of FIG. 1; and FIG. 6 shows the detail of the tabs along the metal panel in position before insertion into a groove in the plastic cover.

DETAILED DESCRIPTION OF THE PREFERRED EMBODIMENT

It will be evident to those skilled in the art that although the invention is described herein with reference to an Ethernet LAN (local area network) communications card conforming to certain PCMCIA size and interface standards, the invention can be applied to cards complying with other PCMCIA size and interface standards and performing other functions. For example, the card can serve as a local area network adaptor, voice mail device, a facsimile device, a modem or can combine LAN adapter and modem functions. Accordingly, the appended claims are not intended to be limited to PCMCIA cards of any specific form factor, interface or function. All of these devices are examples of those intended to come within the scope of the meaning of the term "communication devices" as used herein. Even further, other devices which require communication with one or more additional devices which are now available or which may become available in the future are intended also to come within the meaning of the term communication devices as used herein.

Figure 1:
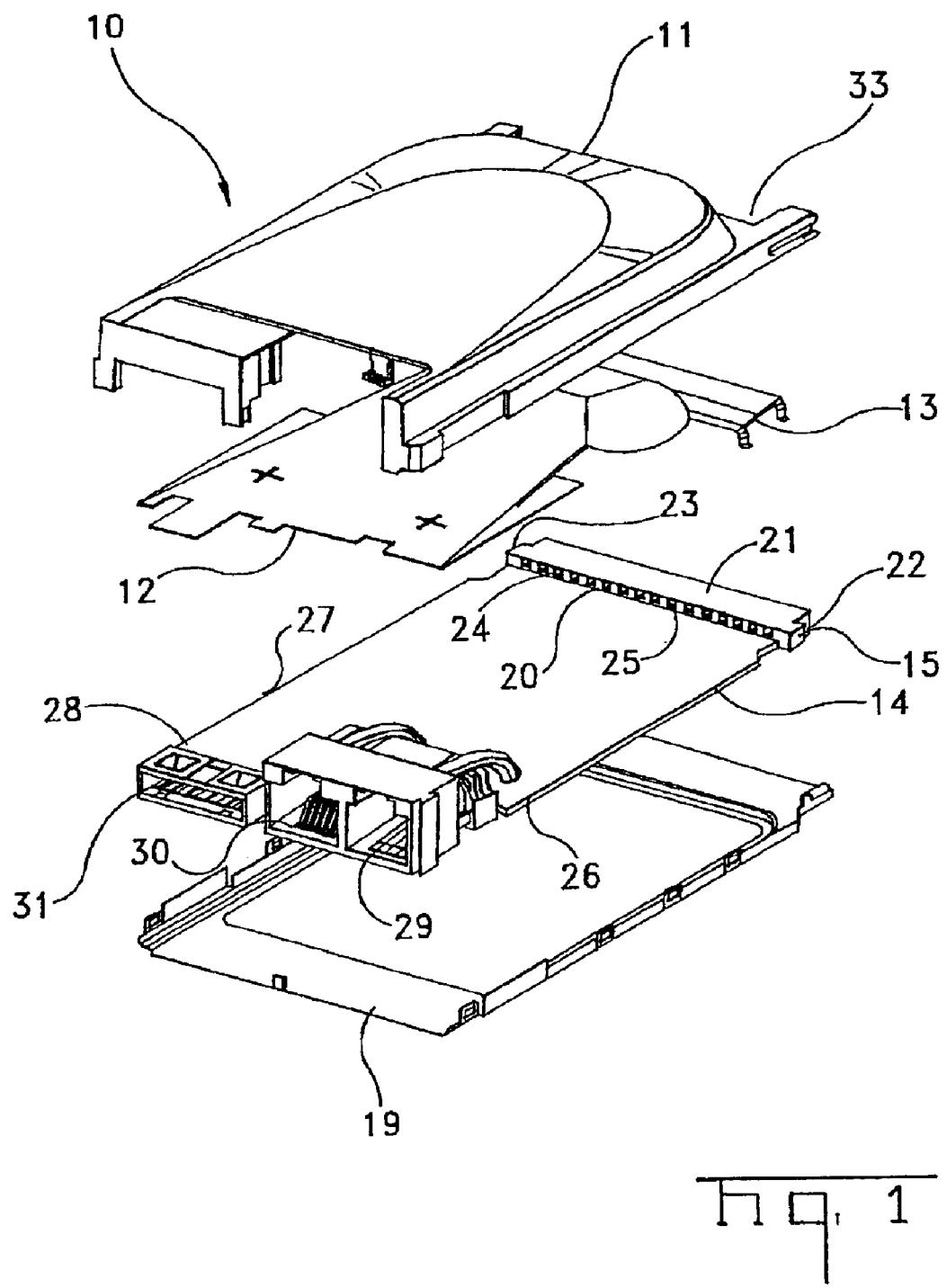
FIG. 1 shows an exploded, top perspective view of the card of the present invention.
Figure 2:
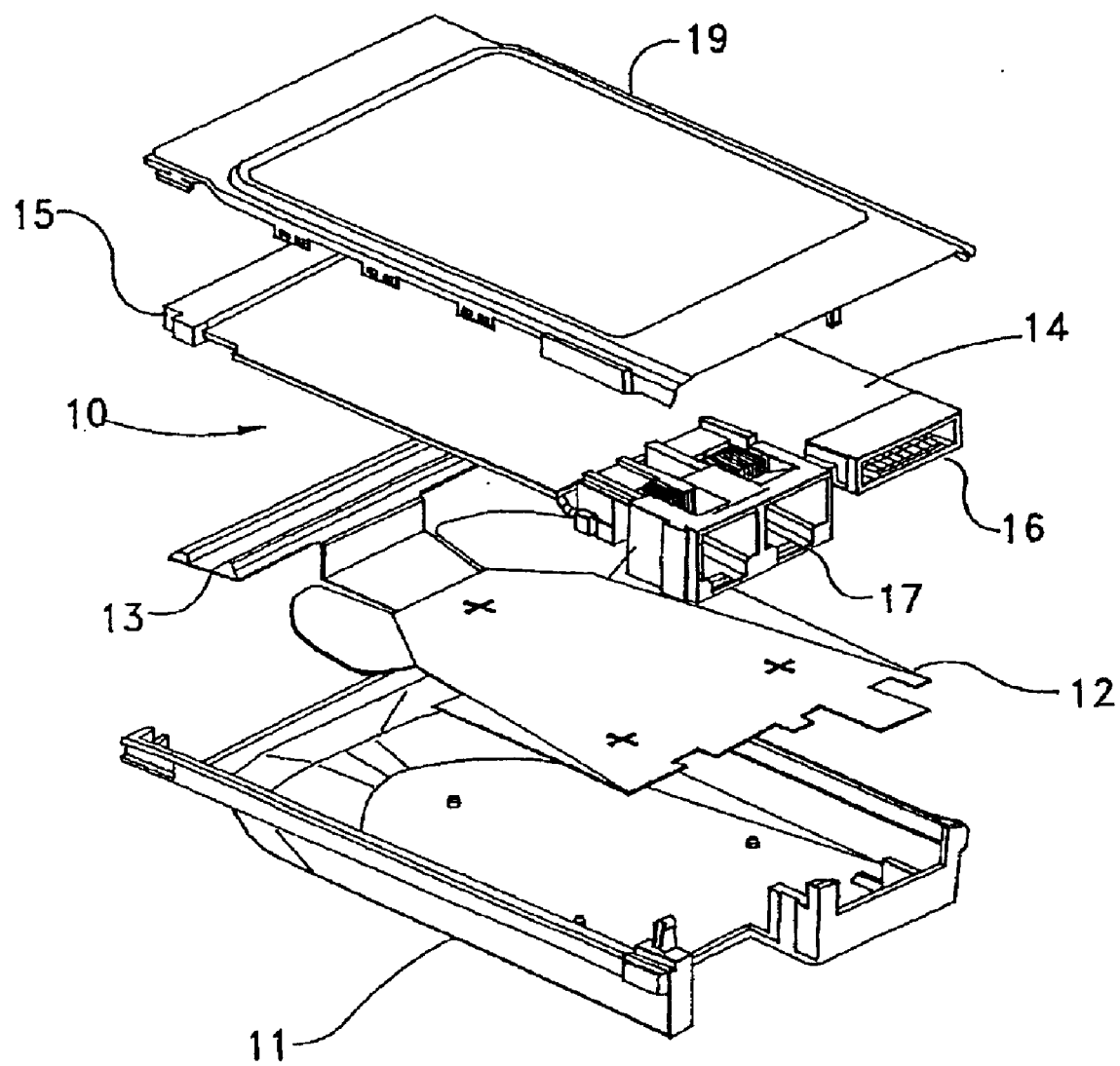
FIG. 2 shows an exploded, bottom perspective view of the card of FIG. 1.

Referring first to FIGS. 1 & 2, there is shown an exploded view of a generally rectangular Ethernet LAN communications card 10 incorporating the present invention. The card 10 conforms to the PCMCIA Type III and 16-bit interface standards. The card 10 comprises the following basic components: (a) a circuit board 14 having a connector 15 connected along a front edge 20 thereof and adapted for electrical connection to a host computer (not shown); (b) a housing for containing the circuit board 14 comprising a plastic top panel 11 with an opening 21 around the connector 15 and a conductive bottom panel 19 interconnected with the top panel 11; and (c) a conductive grounding shield 12 overlying a substantial portion of the circuit board 14 and at least a portion of the connector 15, and being electrically connected to the bottom panel 19. It should be noted that terms such as "top," "bottom," "upper," "lower," "vertical," and the like, are used herein only to facilitate the description of the structure of the card illustrated and should not be used to limit the scope of the invention. Furthermore, it should be evident that the card may be used in any orientation.

The circuit board 14 supports integrated circuit and other electronic components, for example, circuitry necessary for carrying out LAN communication functions which are not depicted although well known in the art. Disposed along a front or forward transverse end 20 of the card 10 is the connector 15 designed to be removably coupled to a corresponding pin connector within a receiving slot of a host system (not shown). The connector 15 may be made of molded plastic and include upper and lower transverse rows of longitudinally extending holes (not shown) each containing a contact for receiving a corresponding pin of the male connector on the host system. Each connector contact includes a rearwardly extending contact finger soldered to an associated conductive trace on the terminal section of the PCB 14. The connector pin assignments are established typically by a PCMCIA 16-bit interface standard. In accordance with the PCMCIA standard, the connector 15 has 68 contacts arranged in two rows of 34 contacts each, with the four end contacts (corresponding to pin Nos. 1, 34, 35 and 68) being assigned ground potential. The connector 15 further includes an upper, horizontal, planar surface 21, opposite ends 22 and 23, and a rear transverse side 24 from which the contact fingers 25 project. Overlying the upper surface 21 of the connector 15 is an extension 13 of the inner ground plate 12 (described later).

The card 14 has parallel, longitudinally extending sides 26, 27 and a transversely extending rear end 28. The rear end 28 of the card 14 has optional input/output ports 29, 30, 31, for connection to a communication line. Depending upon the application, the communication card may comprise additional connectors such as RJ-xx series connectors. Detailed information regarding the RJ-xx series of connectors can be found in the publication found at Title 47 (Telecommunications), Code of Federal Regulations, Chapter I (Federal Communications Commission), Subchapter B (Common Carrier Services), Part 68 (Connection of Terminal Equipment to the Telephone Network), Subpart F (Connectors), Section 68.500 (1992) which is incorporated herein by reference in its entirety. Preferably, the port 30 is an eight-conductor RJ-45 receptacle and the other port 29 is a six-conductor RJ-11 receptacle. Port 31 preferably is a connector which attached directly to a corresponding connector (not shown) on a portable cellular telephone (not shown) or other communication device.

The circuit board and connector(s) assembly is contained in the top and bottom panel sections 11, 19. The top panel 11 comprises an aesthetically-pleasing material, preferably, a plastic, which can be molded readily to any shape and textured as desired. Suitable plastics are well known in the art, although a polycarbonate/ABS blend is preferred. As shown in FIG. 4, top panel is profiled to define a cut-out section 33 to accommodate the connector 15. The panel 11 is molded to increase the profile of the card immediately behind the connector 15 thereby providing the card with a relatively large internal volume. It should be understood, however, that the panel is not restricted in shape since it is formed of a highly-moldable material.

The bottom panel 19 is preferably formed of stamped metal and cooperates with the grounding shield to provide a ground path from the shield to the chassis in which the card is mounted. Consequently, the bottom panel 19 is configured to contact the chassis of the computer, preferably along the periphery of the slot that accommodates the card.

As shown in FIGS. 1 and 2, the panels 11, 19 contain the grounding shield 12 which overlies the circuit board 14. The grounding shield 12 covers a substantial portion of the circuit board, preferably at least about 75% and, more preferably, at least about 90% of the PCB's area. In addition to covering the PCB, as mentioned above, the grounding shield comprises a portion 13 that covers at least a portion of the connector 15. In the embodiment shown in FIG. 3, the portion 13 is an extension for the main body of the grounding shield. By covering the connector, the grounding shield provides protection from EMI and external aggression. Furthermore, because it is metal, portion 13 can be very thin, for example, about 0.008", while still possessing the desired strength. The use of the grounding shield avoids covering the connector with a thin section of plastic from the upper panel which would be structurally weak and provide little or no EMI protection. For example, plastic less than about 0.020" tends to be structurally unsuitable for covering an area as large as the top 21 of the connector 15.

The grounding shield is electrically connected to the bottom panel to provide a ground path through the bottom panel to the chassis in which the card is mounted. Techniques for electrically connecting the grounding shield to the bottom panel are well known and include, for example, a physical connection between the two components or an electrical conduit between them. In the embodiment of FIGS. 1 & 2, the grounding shield is mounted to the bottom panel. This approach not only provides an electrical connection between the components, but also secures the grounding shield within the card.

The present invention also provides plastic and metal panel configurations that can be "welded" together using melting or flowing techniques such as ultrasonic welding. More specifically, referring to FIG. 5 where the underside of the top panel 11 is depicted, it can be seen that a channel 34 is formed along the panel's interface with the bottom panel. This channel provides a cavity to receive projections from the bottom panel.

As shown in FIG. 6, the bottom panel 19 comprises tabs 61 which are insertable into the channel 34 to engage the bottom and top panels. The tabs have a particular geometry or otherwise comprise one or more structures which provide a purchase point for plastic flowing around them. In other words, when plastic flows around the geometry or structures and partially or fully envelopes them, the tab is anchored in the plastic. These structures/geometry are collectively referred to herein as "barbs." In addition to providing a purchase point for flowed plastic, these barbs are preferably configured to be insertable into cavities, but to resist withdrawal. To this end, the barbs are preferably configured to be flexible or to present no edge or a high-friction surface in one direction, while being rigid or presenting an edge in the opposite direction. For example, the barbs 62 have edges 63 that dig into the side 64 of the channel 34 as the tabs are withdrawn from the channel, thereby preventing separation of the metal panel 19 from the plastic panel 11.

Transmitting energy to the plastic around the barbs such that it flows around them can be effected in different ways. For example, this may be accomplished by first inserting the tab within the channel and then applying the ultrasonic energy. Alternatively, energy may be applied to the assembly while inserting the tabs into the channels thereby allowing the barb to plow through the softened plastic.

Any known energy for causing plastic to flow may be used, although ultrasonic energy is preferred. The ultrasonic energy may be applied in any known manor to the plastic around the tab 61, although it is preferred to apply the energy to the metal panel 19, which is a good conductor of such energy, rather than to the plastic panel since ultrasonic energy tends to blemish the finish of plastic components.

What is claimed is:

1. A card for insertion into a receiving slot of a host computer, said card comprising a circuit board enclosed on one side by an exterior plastic panel and on the other side by an exterior metal panel, and being manufactured by the process comprising:

placing said circuit board within said plastic panel and said metal panel, said metal
panel having a plurality of tabs with barbs thereon, said plastic panel having one
or more cavities adapted for receiving said tabs;

inserting the tabs within said one or more cavities; and transmitting energy to plastic around said tab such that said plastic flows at least
partially around said barbs.

2. The card of claim 1, wherein said energy is ultrasonic energy.

3. The card of claim 1, wherein said energy is applied to said metal panel.

4. The card of claim 3, wherein said energy is ultrasonic energy.

5. The card of claim 1, wherein said energy is applied while the tabs are being inserted into said cavities.

6. The card of claim 1, wherein said energy is applied after said tabs are inserted into said cavities.

7. The card of claim 1, wherein said card is a PCMCIA card.

8. The card of claim 7, wherein said card conforms to the PCMCIA, Type III standard.

9. The card of claim 1, further comprising a second connector.

10. The card of claim 9, wherein said second connector is an RJ-xx series connector.

* * * * *